(12) United States Patent
Devegowda (10) Patent No.: US 11,853,769 B2
(45) Date of Patent: *Dec. 26, 2023

(54) DETERMINATION OF POWER-OFF DURATION OF NVME SSD

(71) Applicant: Kioxia Corporation, Tokyo (JP)

(72) Inventor: Jithendra Devegowda, Folsom (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/880,519

(22) Filed: Aug. 3, 2022

(65) Prior Publication Data

US 2023/0016285 A1 Jan. 19, 2023

Related U.S. Application Data

(63) Continuation of application No. 17/137,754, filed on Dec. 30, 2020, now Pat. No. 11,422,825.

(51) Int. Cl.
| | | |
|---|---|---|
| *G06F 9/4401* | (2018.01) | |
| *G06F 13/42* | (2006.01) | |
| *G06F 12/02* | (2006.01) | |
| *G06F 1/28* | (2006.01) | |
| *G11C 16/30* | (2006.01) | |
| *G06F 12/0866* | (2016.01) | |

(52) U.S. Cl.
CPC .............. *G06F 9/4401* (2013.01); *G06F 1/28* (2013.01); *G06F 12/0238* (2013.01); *G06F 13/4221* (2013.01); *G11C 16/30* (2013.01); *G06F 12/0866* (2013.01); *G06F 2212/2022* (2013.01); *G06F 2212/214* (2013.01); *G06F 2213/0026* (2013.01)

(58) Field of Classification Search
CPC ...... G06F 9/4401; G06F 1/28; G06F 12/0238; G06F 13/4221; G06F 12/0866; G06F 2212/2022; G06F 2212/214; G06F 2213/0026; G11C 16/30
See application file for complete search history.

(56) References Cited

U.S. PATENT DOCUMENTS

| | | | |
|---|---|---|---|
| 11,422,825 B2 * | 8/2022 | Devegowda | ........ G06F 12/0238 |
| 2010/0082995 A1 | 4/2010 | Dees et al. | |
| 2013/0007543 A1 | 1/2013 | Goss et al. | |
| 2015/0169398 A1 | 6/2015 | Chunn et al. | |
| 2017/0062023 A1 | 3/2017 | Datta et al. | |
| 2017/0177241 A1 | 6/2017 | Erickson et al. | |
| 2018/0260134 A1 | 9/2018 | Li | |
| 2019/0034114 A1 | 1/2019 | Natarajan et al. | |
| 2020/0210207 A1 | 7/2020 | Trika | |
| 2020/0356438 A1 | 11/2020 | Kim et al. | |

* cited by examiner

*Primary Examiner* — Glenn A. Auve
(74) *Attorney, Agent, or Firm* — Allen & Overy LLP (57) ABSTRACT

An SSD includes a controller having a first non-volatile memory in which a power-off timestamp is stored, and a hardware register accessible by a host. The SSD also includes a second non-volatile memory coupled to the controller, the second non-volatile memory storing instructions for at least one boot-up mode of the SSD. Upon power up of the controller and prior to the controller executing the instructions for at least one boot-up mode of the SSD, the controller receives, in the hardware register, a power-on timestamp from the host and determines, based on the power-on timestamp and the stored power-off timestamp, a boot-up mode of the SSD.

21 Claims, 7 Drawing Sheets

DETERMINATION OF POWER-OFF DURATION OF NVME SSD

CROSS-REFERENCE TO RELATED APPLICATION

This application is a continuation of U.S. application Ser. No. 17/137,754 filed on Dec. 30, 2020, the entire contents of which is incorporated herein by reference.

FIELD OF THE INVENTION

The present invention generally relates to systems and methods for determining a power-off duration of a solid state drive ("SSD").

BACKGROUND OF THE INVENTION

SSDs and other devices coupled to flash memory store data and instructions as charges within the flash memory. Over time, if the SSD remains idle, the charges can leak away introducing errors to the stored data and instructions and in some cases rendering coded data and instructions undecodeable. If the SSD attempts to power up based on code stored in flash memory which contains too many errors, the SSD power up may fail and the SSD can become unusable.

This is particularly problematic when SSD drives are not used regularly or right away, for example drives which are kept as replacement or backup drives in a data center. If the drive is powered off for an extended period of time, the NAND is not active and data retention of the drive may suffer. If the drive has been powered off for too long, there may be a failure in reading data from the memory upon start-up of the drive. The drive may not be able to process instructions or metadata written to the NAND and the drive will become inactive and unusable.

Though SSDs may contain additional instructions to enable the device to boot-up into a factory mode as if powered on for the first time, the device cannot determine prior to startup whether a factory boot-up mode will be required.

Accordingly, there is an unmet need to develop a mechanism for SSDs to determine a power-off duration before start-up of the SSD.

BRIEF DESCRIPTION OF THE INVENTION

In an aspect, an SSD includes a controller having a first non-volatile memory which stores a power-off timestamp, and a hardware register accessible by a host. The SSD also includes a second non-volatile memory coupled to the controller, the second non-volatile memory storing instructions for at least one boot-up mode of the SSD. Upon power up of the controller and prior to the controller executing the instructions for at least one boot-up mode of the SSD, the controller receives, in the hardware register, a power-on timestamp from the host and determines, based on the power-on timestamp and the stored power-off timestamp, a boot-up mode of the SSD.

In another aspect, a method of determining a boot-up mode of an SSD includes receiving, at a hardware register of a controller, a power-on timestamp from a host upon power up of a controller, and retrieving a power-off timestamp from a first non-volatile memory coupled to the controller. The method also includes comparing the power-on timestamp and the power-off timestamp to determine a delta time, and determining a boot-up mode of the SSD based on a comparison of the delta time to a threshold.

BRIEF DESCRIPTION OF THE FIGURES

The foregoing and other objects and advantages will be apparent upon consideration of the following detailed description, taken in conjunction with the accompanying drawings, in which like reference characters refer to like parts throughout, and in which.

DETAILED DESCRIPTION OF THE INVENTION

An SSD or other device coupled to flash memory can boot using microcode or instructions stored in a non-volatile memory, then it can boot using code and metadata (e.g. a logical to physical mapping table) stored in the flash memory. When the device has booted from the non-volatile memory and then proceeds to boot using code and/or data from flash memory, if the flash memory contains unrecoverable errors (because it has been switched off and dormant for too long a period for example) the SSD can fail to execute instructions correctly and become unusable. Enabling the SSD controller to determine a power-off duration upon initialization of the controller and prior to execution of instructions for boot-up using code and/or data in flash memory allows the SSD controller to determine whether it is likely that unrecoverable errors have been introduced into the flash-stored boot-up mode instructions such that the SSD must boot from the factory instructions stored in the non-volatile controller memory. The SSD can then choose whether to boot up as usual from the flash or to revert to a factory boot up as if it is being powered on for the first time based on the power-off duration to avoid the drive becoming unusable.

Figure 1:
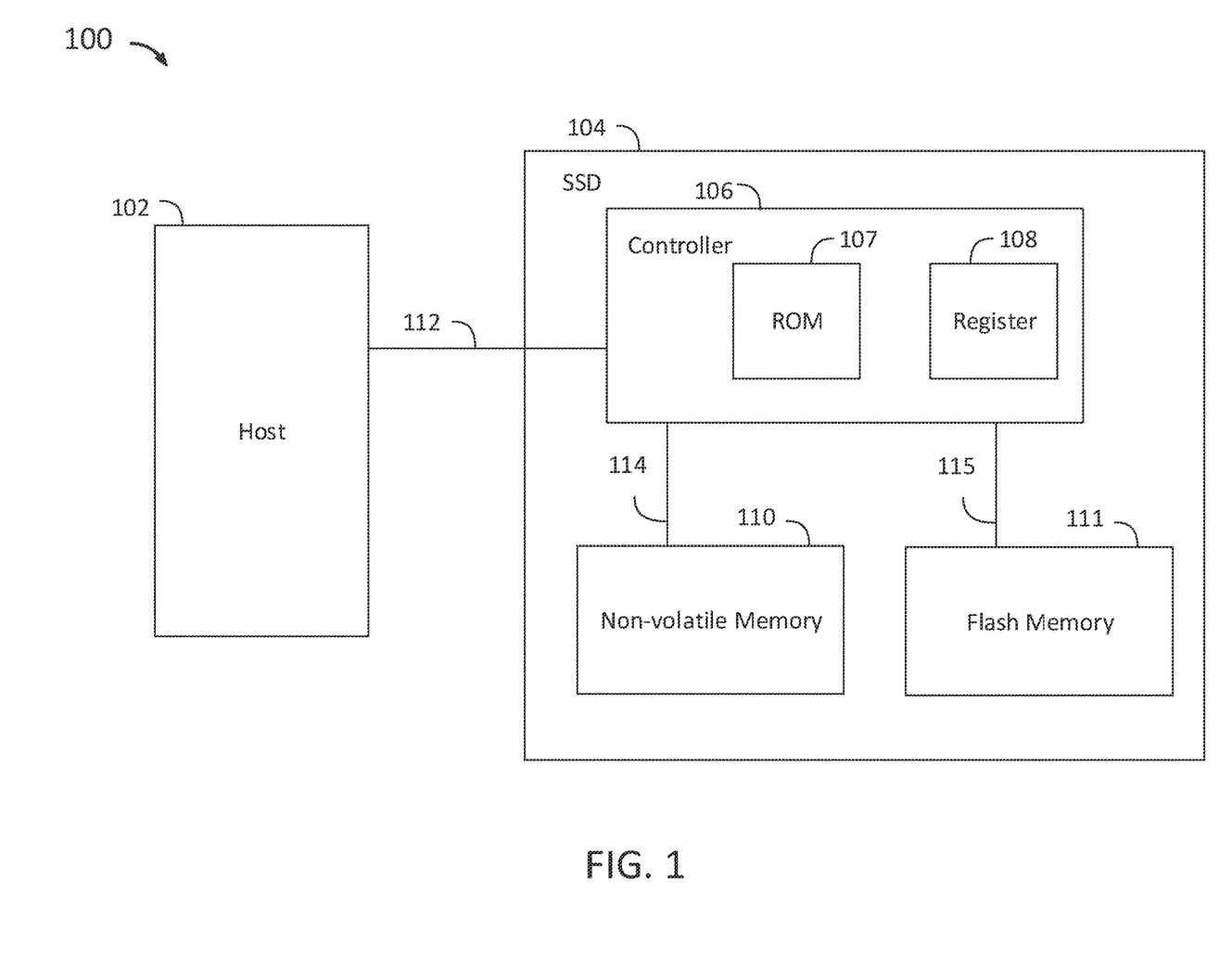
FIG. 1 shows a block diagram of a solid-state drive ("SSD") memory device system which supports determination of a power-off duration of the SSD.

FIG. 1 shows a block diagram of an SSD memory device system 100 supporting determination of a power-off duration of the SSD. The SSD memory device system 100 includes a host 102 and an SSD 104. The SSD 104 has a controller 106 including a read only memory (ROM) 107 and a register 108. The controller 106 is coupled to a non-volatile memory 110 by connection 114, and is coupled to a flash memory 111 by connection 115. The host 102 is communicatively coupled to the controller 106 of the SSD 104 by bus 112.

The register 108 may be a hardware register, which does not require software configuration or system firmware. The register 108 is visible to the host 102 as a valid register to which the host 102 can write a timestamp as soon as power is applied to the SSD 104, before the SSD 104 has booted up or accessed the flash memory 111. Because the register 108 is a base-level hardware register, the SSD controller 106 can access the timestamp while booting up. The SSD controller 106 may be an NVMe (nonvolatile memory express) controller 106, and the NVMe core in the controller chip relies on hardware registers and microcode to function and interpret commands. The host 102 is able to write a power-on timestamp to the register 108 with just the power being applied to the SSD 104.

The controller 106 accesses the power-on timestamp from the register 108, and a power-off timestamp stored in a non-volatile memory 110 upon a previous power-off of the SSD 104. The controller 106 determines a power-off duration by calculating the difference between the power-on timestamp supplied by the host 102 in the register 108 and the power-off timestamp stored in the non-volatile memory 110. Based on the calculated power-off duration, the controller 106 determines an appropriate boot-up mode of the SSD 104. Microcode and firmware for booting the controller chip and SSD 104 can then be loaded into the controller 106 from storage in the non-volatile memory 110 (for example a serial NOR ROM or NOR flash memory), other non-volatile memory, or hardware register such as register 108. The non-volatile memory 110 or hardcoded microcode and firmware does not suffer from data retention issues common to NAND flash memory such as charge leakage over time. The process of receiving the power-on timestamp from the host 102 and determining a boot-up mode for the SSD 104 is detailed in FIGS. 3 and 4.

Figure 2:
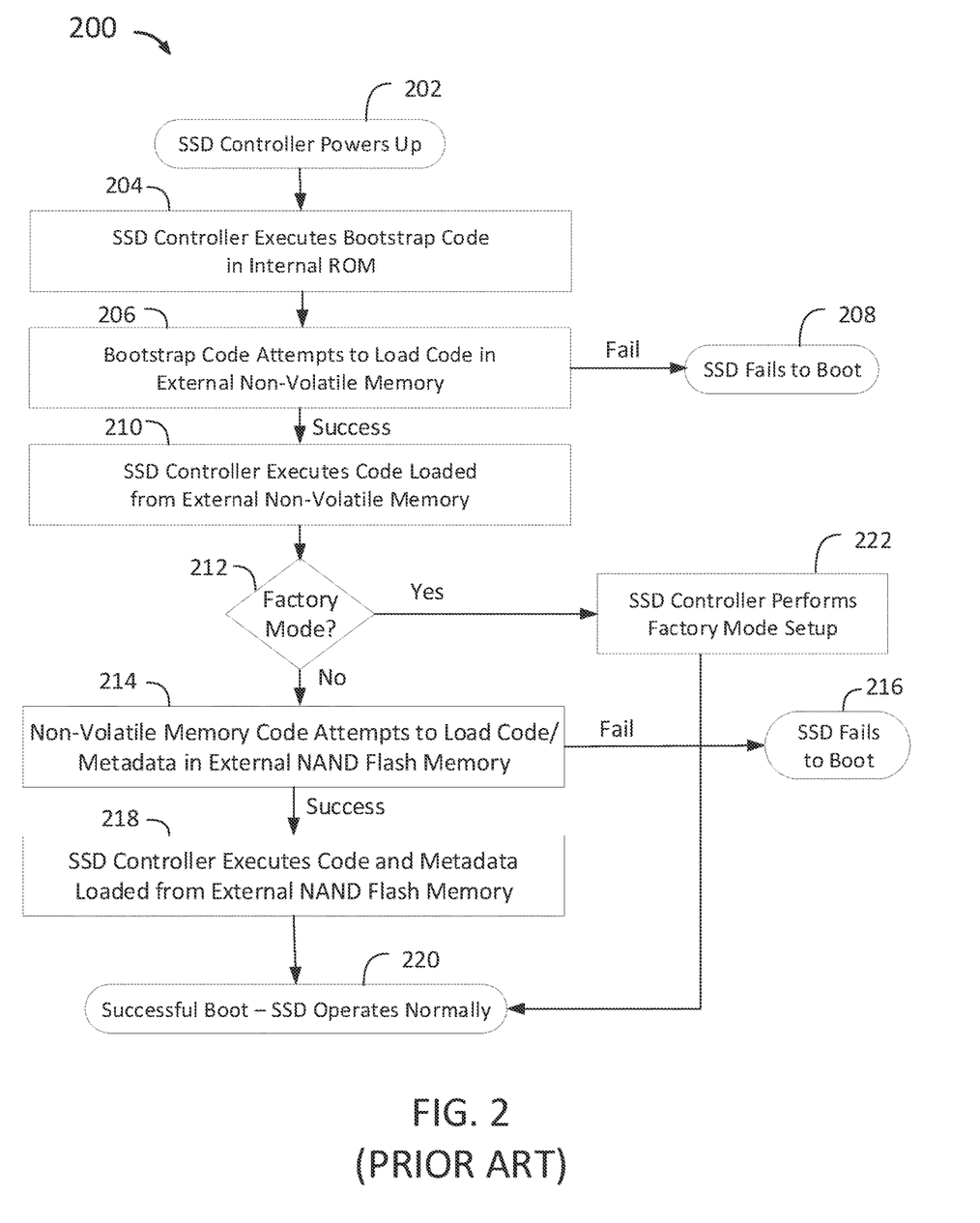
FIG. 2 shows a flow diagram of a conventional boot process of an SSD.

FIG. 2 shows a flow diagram 200 of a conventional boot process of an SSD. The process begins at step 202 when the SSD controller is powered up. The SSD controller then executes bootstrap code in the on-chip read-only memory ("ROM") at step 204. At step 206 the bootstrap code attempts to load the initial code stored in the external non-volatile memory. If the bootstrap code fails to load the initial code (step 208), the execution stops and the SSD fails to boot correctly.

At step 210, the code from the external non-volatile memory is executed and at step 212, the non-volatile memory checks if factory mode is set. If factory mode is set (YES), the process jumps to step 222 where the SSD controller performs the factory mode setup, including a test of the NAND flash. If factory mode is not set (NO), the process continues to step 214, where the non-volatile memory code attempts to load further code and metadata stored in flash memory. If the non-volatile memory code fails here (step 216), normal execution stops and the SSD fails to boot correctly. If the non-volatile memory code is successful in loading the further code and metadata stored in the flash memory, the process continues to step 218 where the SSD controller executes the code and metadata from the external flash memory, resulting in a successful boot in which the SSD operates normally (step 220).

Figure 3:
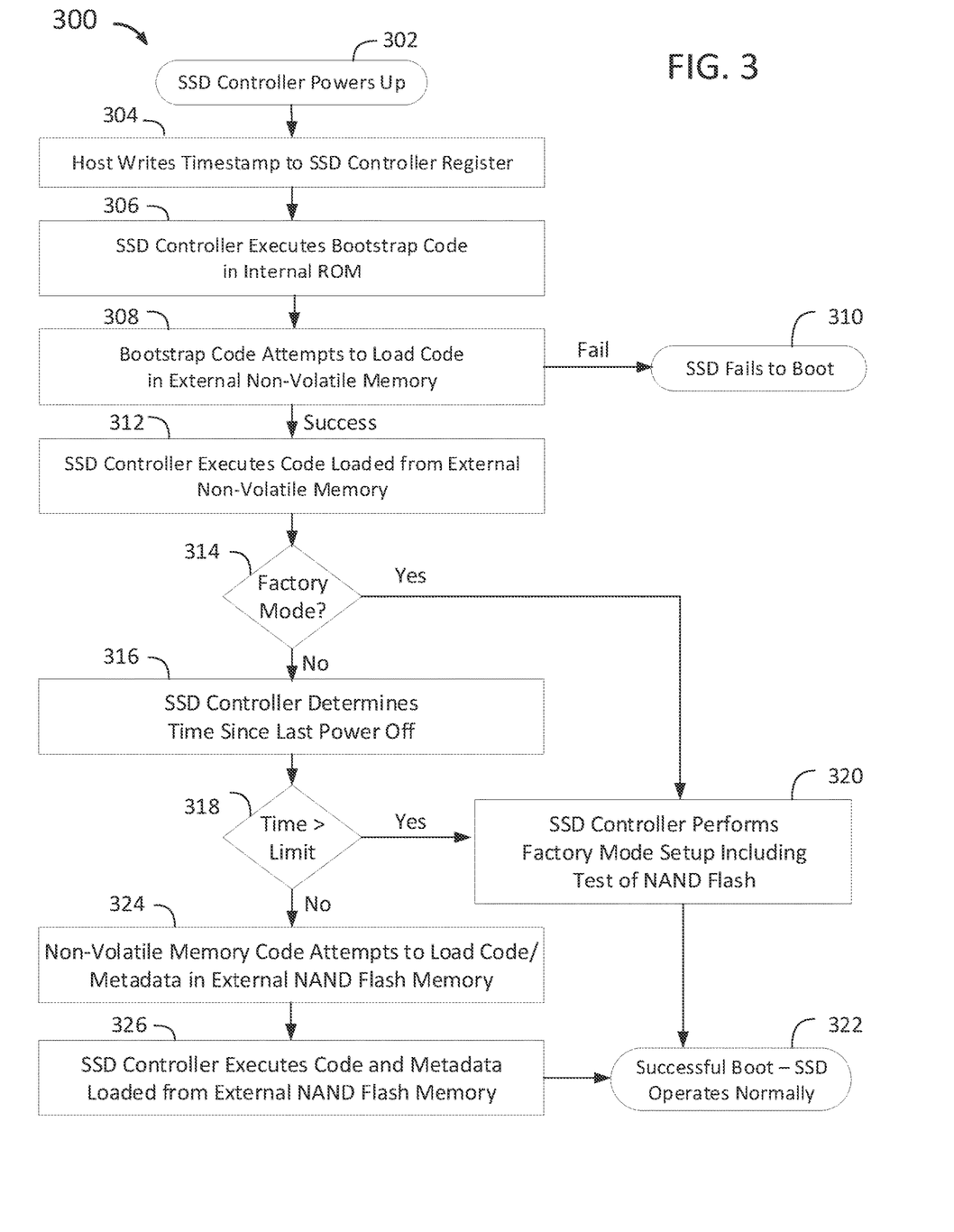
FIG. 3 shows a flow diagram of a boot process utilizing a determined power-off duration of an SSD.

FIG. 3 shows a flow diagram 300 of a boot process utilizing a determined power-off duration of an SSD. The process begins at step 302 when the SSD controller is powered up. At step 304, the host writes the timestamp to the SSD controller register. At step 306, the SSD controller executes bootstrap code in an internal ROM. At step 308, the bootstrap code attempts to load initial code stored in an external non-volatile memory. If the bootstrap code fails to load the code, the SSD fails to boot properly (step 310). If the bootstrap code succeeds in loading the initial code, the process continues to step 312 and the SSD controller executes the code loaded from the external non-volatile memory. At step 314, the non-volatile memory checks if factory mode is set. If factory mode is set, the process jumps to step 320 and the SSD controller performs the factory mode setup including a test of the NAND flash, and continues to a successful boot in which the SSD operates normally in step 322.

If factory mode is not set, at step 316 the SSD controller determines the time since the last power-off, based on the timestamp written by the host in step 304 and stored power-off timestamps in the controller. At step 318, the controller determines whether the time since the last power-off is greater than a limit or threshold. The threshold may be predetermined, or may be a calculated value based on operating parameters of the SSD (including, but not limited to, the type of NAND flash memory 111, the number of program/erase cycles already experienced by the NAND flash memory 111, the temperature conditions under which the NAND flash memory 111 previously operated under and the current temperature). If the time since the last power-off is greater than the threshold, the process jumps to step 320 and the SSD controller performs the factory mode setup including a test of the NAND flash, and continues to a successful boot in which the SSD operates normally in step 322. If the time since the last power-off is not greater than the limit (i.e., is less than or equal to the limit), at step 324 the non-volatile memory code attempts to load code and/or metadata in the external NAND flash memory. At step 326, the SSD controller executes the code and metadata loaded from the external NAND flash memory, and successfully boots such that the SSD operates normally at step 322.

In contrast to the conventional booting process, FIG. 3 illustrates the use of a current timestamp from the host in determining how long it has been since the SSD last powered off (step 316). If the time exceeds a limit at step 318, the execution jumps to factory mode setup, which will include a test of the NAND flash to make sure it can be read and written to properly. This use of timestamps to determine a power-off duration of the SSD optimizes the utilization of memory internal to the chip. On-chip memory can be expensive, but is immutable and cannot be altered once the chip has been manufactured. This is an advantage for code functions like security functions for checking externally stored code is legitimate and has not been hacked or otherwise tampered with. The use of an external serial NOR non-volatile memory complements the internal memory and reduces the cost required for internal or on-chip memory. The serial NOR non-volatile memory can be re-programmed and changed to upgrade the code stored therein, or so that different versions of code can be provided for different products. To reduce the cost of the NOR, the code in the NOR performs the minimum required functions before transferring execution to the code stored in the flash memory. However, if the SSD has been powered off for too long, the flash memory may fail because exceeding the retention period specified for the flash memory can result in unrecoverable errors occurring when the flash is read to retrieve the code and/or metadata for the booting process. Utilizing the timestamps to determine if the retention period has been exceeded prior to accessing the flash memory reduces the risk of SSD failure during the booting process.

Figure 4:
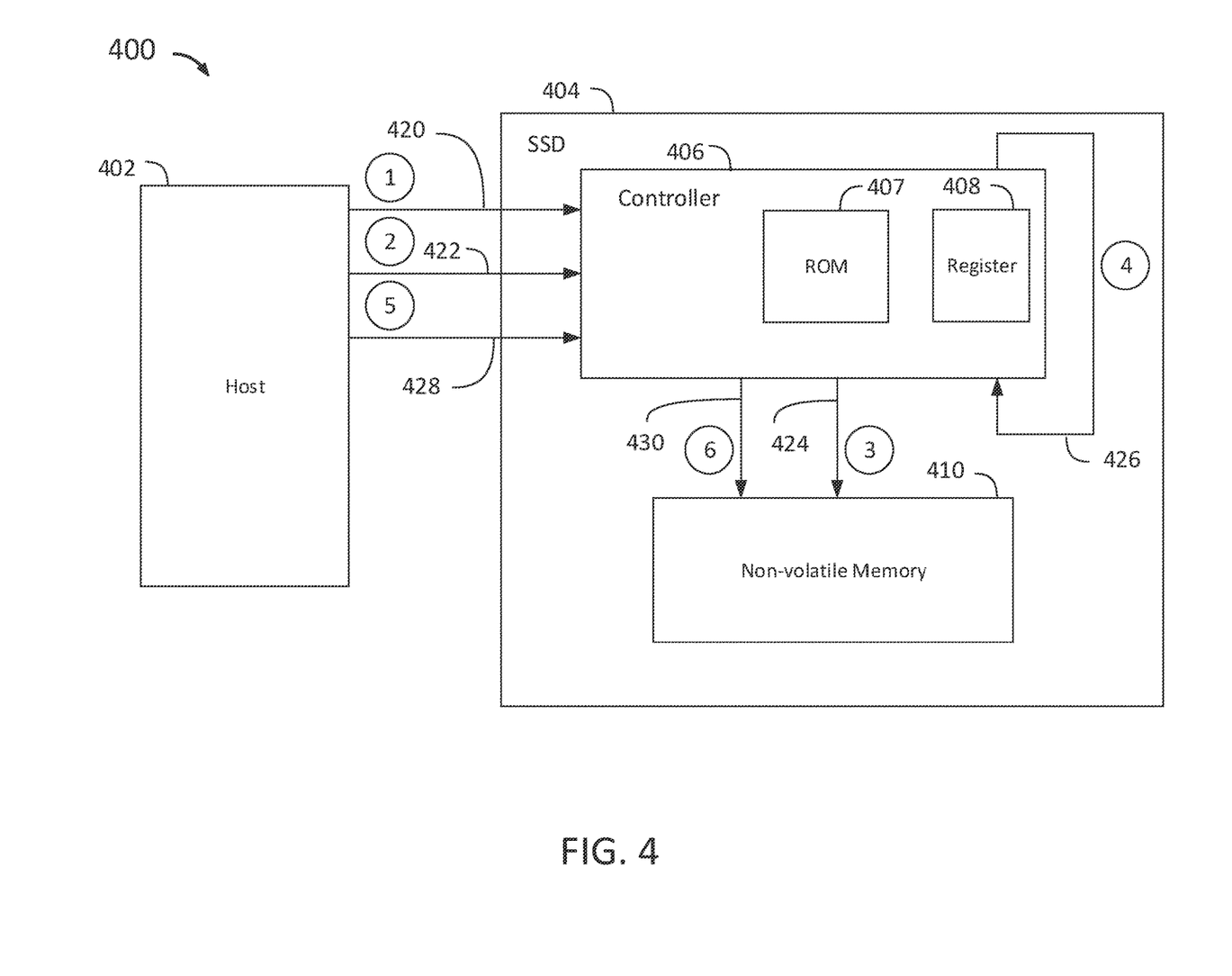
FIG. 4 shows a block diagram of a process of determining a power-off duration of the SSD for use in determining a boot-up mode of the SSD.

FIG. 4 shows a block diagram of a process 400 of determining a power-off duration of the SSD for use in determining a boot-up mode of the SSD. The SSD may be the SSD of FIG. 1. The SSD memory device system 400 includes a host 402 (for example host 102 of FIG. 1) and SSD 404 (for example SSD 104 of FIG. 1). The SSD 404 has a controller 406 (for example controller 106 of FIG. 1)

including an on-chip ROM 407 (for example ROM 107 of FIG. 1) and a register 408 (for example register 108 of FIG. 1). The controller 406 is coupled to a non-volatile memory 410 (for example non-volatile memory 110 of FIG. 1). The host 402 is communicatively coupled to the controller 406 of the SSD 404. The SSD 404 may also include a flash memory as well as other components, though these are omitted from FIG. 4 for clarity.

At step 1, as part of the initial setup of the controller 406 upon initialization by the host 402, the host 402 writes the current timestamp into the register 408. This timestamp is the power-on timestamp reflecting the time at which the controller is initialized for powering on. The power-on timestamp may be in the form of the number of milliseconds that have elapsed since midnight on Jan. 1, 1971 UTC. This step is illustrated by arrow 420 from the host 402 to the controller 406. Initialization of a controller to begin executing commands may include a sequence of actions including setting the registers based on system configuration, indicating to the host that the previous reset is complete, configuring queues such as the admin queue, and configuring controller settings. The host 402 writes the power-on timestamp into the register 408 as part of the configuration of the settings of the controller 406 during the initialization process. The host 402 then enables the controller by writing a 1 in the enable bit ("EN bit") of the controller configuration register, at step 2. This step is illustrated by arrow 422 from the host to the controller.

At step 3, the controller 406 retrieves a power-off timestamp saved in the non-volatile memory 410 of the SSD 404. The power-off timestamp is saved prior to powering off of the SSD 404. Step 3 is illustrated by arrow 424 from the controller 406 to the non-volatile memory 410. At step 4, the controller 406 calculates the difference, or delta, between the retrieved power-off timestamp and the power-on timestamp written by the host 402 into the register 408. The difference between the retrieved power-off timestamp and the power-on timestamp is the power-off duration of the SSD 404, or the length of time for which the SSD 404 has been powered down. Based on the calculated power-off duration and a set threshold or limit (which may vary according to the type of NAND flash memory 111, the number of program/erase cycles already experienced by the NAND flash memory 111, the temperature conditions under which the NAND flash memory 111 previously operated under and the current temperature), the controller 406 performs necessary operations for the boot process, illustrated by arrow 426.

Figure 6:
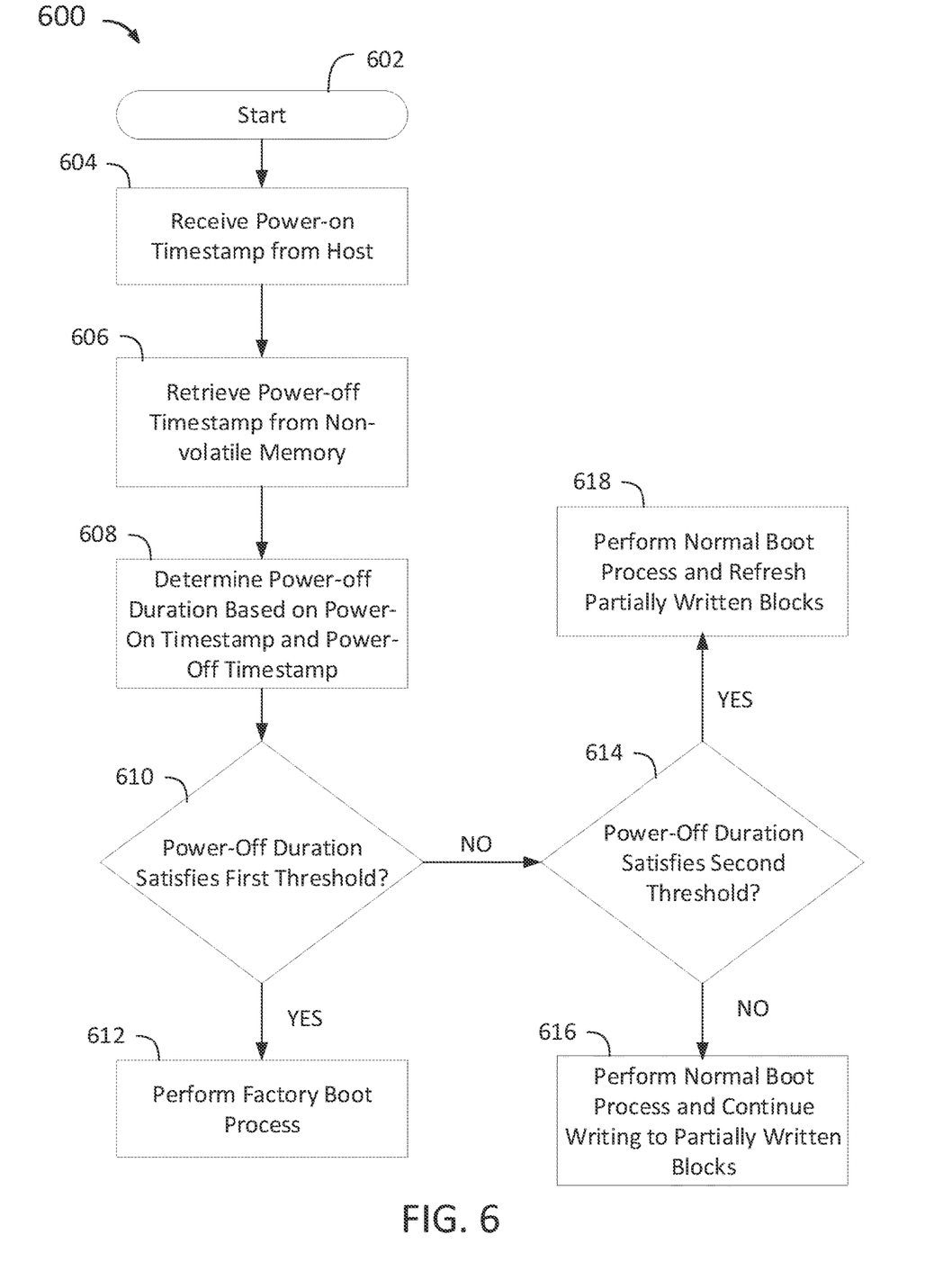
FIG. 6 shows a decision chart for determining a boot-up mode of an SSD based on a power-off duration.
Figure 7:
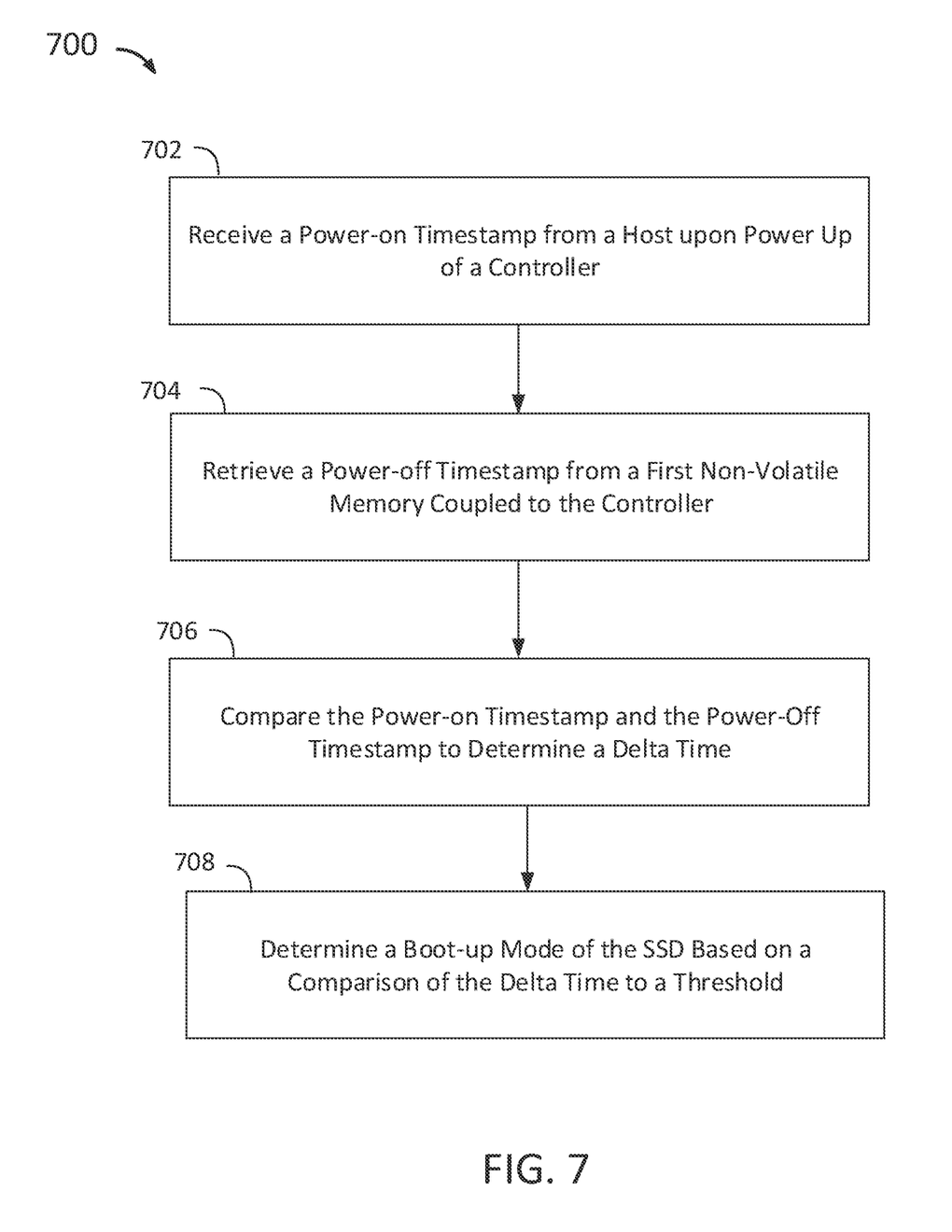
FIG. 7 shows a flow diagram for a method of determining a boot-up mode of an SSD.

As will be further described with respect to FIGS. 6 and 7, the controller 406 determines an appropriate boot mode of the SSD 404 by calculating the power-off duration, comparing the duration to a set threshold, and based on the comparison determining how to proceed with the initialization of the controller. If the calculated power-off duration satisfies the threshold, the controller 406 proceeds with a factory reset boot mode, and if the calculated power-off duration fails to satisfy the threshold, the controller 406 initializes the controller 406 and SSD 404 as usual including accessing boot instruction in the flash memory.

In particular, if the calculated power-off duration meets or exceeds an offline data retention time of the SSD 404, the controller 406 may choose not to try to retrieve the previous state of the SSD 404 from NAND (not shown) because of the risk of unrecoverable errors causing the SSD 404 to become unusable. Instead, the controller 406 may choose to boot the SSD 404 using a factory boot mode as if it were powered on for the first time. The offline data retention time of the SSD 404 is determined by the controller 406, by loading a value stored in the non-volatile memory which may be a default, predetermined value or a value based on operating parameters of the SSD (including, but not limited to, the type of NAND flash memory 111, the number of program/erase cycles already experienced by the NAND flash memory 111, the temperature conditions under which the NAND flash memory 111 previously operated under and the current temperature). The value is programmed in the controller 406 as a threshold to which the power-off duration is compared. The offline data retention time of the SSD 404 may be on the order of weeks, months or years. In some implementations, the offline data retention time of the SSD 404 is three months. In some implementations, the offline data retention time of the SSD 404 is temperature dependent.

Knowing the exact power-off duration of the SSD 404 allows the controller 406 to accurately determine whether the SSD 404 should be booted in a safe mode. If the SSD 404 has been stored for a long period of time that exceeds the offline data retention time of the SSD 404, charge leakage in the flash memory may lead to instructions in flash memory required for a normal boot-up mode of the drive having developed unrecoverable errors that make the SSD 404 unable to boot normally.

In some implementations, additional thresholds may be predetermined and set within the controller 406 for comparison by the controller 406 to the power-off duration to determine other aspects of the SSD 404 start-up, such as error correction process or whether to refresh partially written blocks. These thresholds may be much shorter than the offline data retention time of the SSD 404 threshold, on the order of hours, days or weeks.

The controller 406 can also use the calculated power-off duration of the SSD 404 to determine an error correction method or de-bugging method for read errors encountered while accessing the flash memory. Information about recent power-cycles and durations of power-off enable the controller 406 to predict issues that might occur in the SSD 404 based on the power-off duration compared to a threshold. The controller 406 can then select an appropriate error correction method to de-bug expected issues based on the lapsed time since the SSD 404 was last powered off.

Additionally, power-off duration information available to the controller 406 can allow the controller 406 to determine an appropriate write mode to blocks of flash memory. Flash memory is written to page sequentially, and it is necessary to fill each block rather than leaving a block partially written such that the number of pages written is not the full block. During every power cycle, the SSD 404 refreshes any open or partially filled blocks at the boot time by moving the data from the partially written block to a new block and recycling the partially written blocks in order to avoid reliability issues. In a clean shutdown procedure signaled by the host, the block would not be partially filled. However, in an unexpected power down situation, such as a power failure, blocks of flash memory may be partially filled at the time of shutdown. If the SSD 404 is powered down for a significant period of time, data in the partially written block may become unreliable and must be moved to the next block and writing should continue with the next block. However, if the power-off duration was sufficiently brief, no refresh of the blocks is necessary and the controller 406 can allow writing to continue to the same partially filled block because the time delay between power cycles was not long enough to make the written data to the partially filled block unreliable. The controller 406 compares the calculated power-off duration to a threshold set based on the time duration that blocks can be in an erased state during power-off to determine if a refresh is required, or if writing can continue with the partially filled block. Doing so improves the SSD 404 time to ready because no refresh is needed for open blocks, and avoids unnecessary NAND wear out. In such situations, the controller 406 can also use the power-off duration to determine an appropriate error correction method to correct errors in the partially written blocks. Use of the power-off duration information by the controller for this purpose requires an accurate power-off timestamp.

When the controller 406 is finished performing the boot process operations, the controller 406 sets a status bit accessible to the host 402 to signal readiness of the controller 406 to receive commands, such as a storage command, from the host 402. In particular, the controller 406 sets the RDY status bit in a controller status register (not shown). The RDY status bit indicates readiness to accept NVMe I/O commands, though the controller 406 may be able to accept NVMe Admin commands prior to setting the status bit. The host 402 waits for this signal from the controller 406 signifying that the controller 406 has finished initializing and is ready to receive and process commands, for example NVMe I/O commands from the host 402.

At step 5, illustrated by arrow 428 from the host 402 to the controller 406, the host 402 transmits I/O commands to the controller 406. At this time, the host 402 can also provide the NVMe command timestamp as part of a "set features timestamp" command to the SSD 404. In most cases, because the NVMe "set features timestamp" command arrives from the host 402 following execution of instructions for boot-up of the SSD 404, the NVMe "set features timestamp" command cannot be relied upon to supply the power-on timestamp from which the controller 406 will make decisions for choosing a boot-up mode of the SSD 404.

In some implementations, the controller 406 may include instructions for a two-stage boot-up process, initially using boot code stored in an SPI flash to enable the controller 406 to receive the NVMe "set features timestamp" command from the host, and on the basis of the received timestamp determining power-off duration and begin execution of the main boot-up code accessed from the non-volatile memory. In this case, the "set features timestamp" command is not received as an I/O command that would require submission queues and completion queues to be set up in the controller 406 to handle the command, and the controller 406 can access the timestamp prior to accessing boot-up instructions from flash memory.

At step 6, illustrated by arrow 430 from the controller 406 to the non-volatile memory 410, the controller 406 logs the power-off timestamp in the non-volatile memory. In some implementations, the power-off timestamp is saved in the non-volatile memory 410 immediately prior to the point at which the controller 406 powers off In some implementations, the controller 406 periodically updates the power-off timestamp in the non-volatile memory 410. For example, the controller 406 may update the power-off timestamp every hour, every 24 hours, ever week, or every month, or at any other suitable period. To periodically update the timestamp, the controller 406 internally tracks the time the SSD 404 has been powered on and adds to it the timestamp received from the host in step 1 to get the current time.

For SSDs which have power loss protection (PLP) capacitors that supply backup power after an unexpected power loss, if power is lost unexpectedly, the controller 406 updates the power-off timestamp as part of the PLP shutdown process using residual capacitor power. In other implementations, for SSDs without PLPP capacitors, when power is unexpectedly lost, the controller 406 does not update the power-off timestamp and relies on the last power-off timestamp saved to the non-volatile memory 410 during the periodic update of the timestamp.

While FIG. 4 illustrates the controller 406 saving the power-off timestamp in the non-volatile memory 410, the power-off timestamp may be saved in another persistent non-volatile memory of the SSD 404. For example, the power-off timestamp can be updated in the ROM 407, external NOR ROM, controller register, or power-off timestamp register. The power-off timestamp can be saved to any persistent memory of the controller 406 which is accessible by the controller 406 prior to full boo-up of the drive. The NOR ROM contains boot up code and metadata that cannot be saved in the NAND. The information in the NOR is sufficient for the drive to power-on and to access the flash memory, or to allow the drive to boot up as if fresh from factory installation. Generally, the NOR ROM is a separate external memory of the controller 406 itself, which can be used to update firmware. In some implementations, the controller 406 periodically updates the power-off timestamp and also updates the power-off timestamp at the time of shut down of the SSD 404.

In another implementation, the timestamp is saved in a register of the controller 406, for example a PCIe/NVMe controller register accessible to the microcode. The hard-coded registers are accessible by the host upon application of power irrespective as to how the microcode and firmware are loaded. The SSD 404 is visible to the host 402 as a valid NVMe or PCIe device, and the host can access the registers before NOR code or bootstrap ROM code has been started up. In some implementations, the power-off timestamp is saved separately from the power-on timestamp. In some implementations, the power-off timestamp is saved in the register 408 with the power-on timestamp.

In some implementations, a history of the power-on and power-off timestamps is maintained by the controller 406, in the non-volatile memory 410 and/or register 408 of the SSD 404. The controller 406 may use the history to determine a cumulative power-off duration of the SSD 404 for use in determining an appropriate boot up method or other SSD process such as error correction process. In some implementations, the controller 406 saves a history of the power-on and power-off timestamps as a complete history of power-on and power-off timestamps, and/or as a complete history of power-off durations. In some implementations, the history is saved as a subset of power-on and power-off timestamps or power-off durations, for example the last 10 timestamps or durations. In some implementations, the controller 406 saves the history as a cumulative power-off time for use in determining the power-on mode or other processes of the SSD 404. By storing and considering cumulative power-off time, the controller 406 can determine if multiple short power-off periods are collectively equivalent to a longer power-off duration requiring a refresh of partially written blocks or implementation of a particular error correction or de-bugging strategy.

To implement the process described in relation to FIG. 4 in an NVMe device, support for the timestamp register 408 under the controller registers set would be added to the NVMe specification. The NVMe driver at the application layer would need to perform a memory write transaction to write the timestamp register 408 with the current host system time, and the SSD controller 406 would need to update the timestamp as time passes in a memory persistent across power cycles and reset commands. This is accomplished by saving the power-off timestamp into a non-volatile memory 410 of the SSD 404 as described above.

Although FIGS. 1, 3, and 4 describe the determination of a power-off duration in the context of SSDs, calculating power-off duration for use in determining an appropriate boot-up mode or other process is useful in a variety of devices that use flash memory to store data essential to a normal booting process. For example, the method of receiving power-on timestamp, retrieving a saved power-off timestamp, and determining the power-off duration from these would be applicable to devices in general using a PCIe express bus, such as a network interface controller (NIC), for example an Ethernet NIC, which relies on data stored in NAND required during a normal boot process. If the Ethernet NIC attempts to read the NAND after being powered down for too long, the Ethernet NIC may encounter an unrecoverable error in trying to read the NAND. The Ethernet NIC, a PCIe device, or any other similar device with a NAND flash memory relied on during the normal boot process, could benefit from incorporating the method described above in FIGS. 1, 3, and 4 to receive a power-on time from the device controlling it and store a power-off time for use in this determining the boot-up mode.

Figure 5:
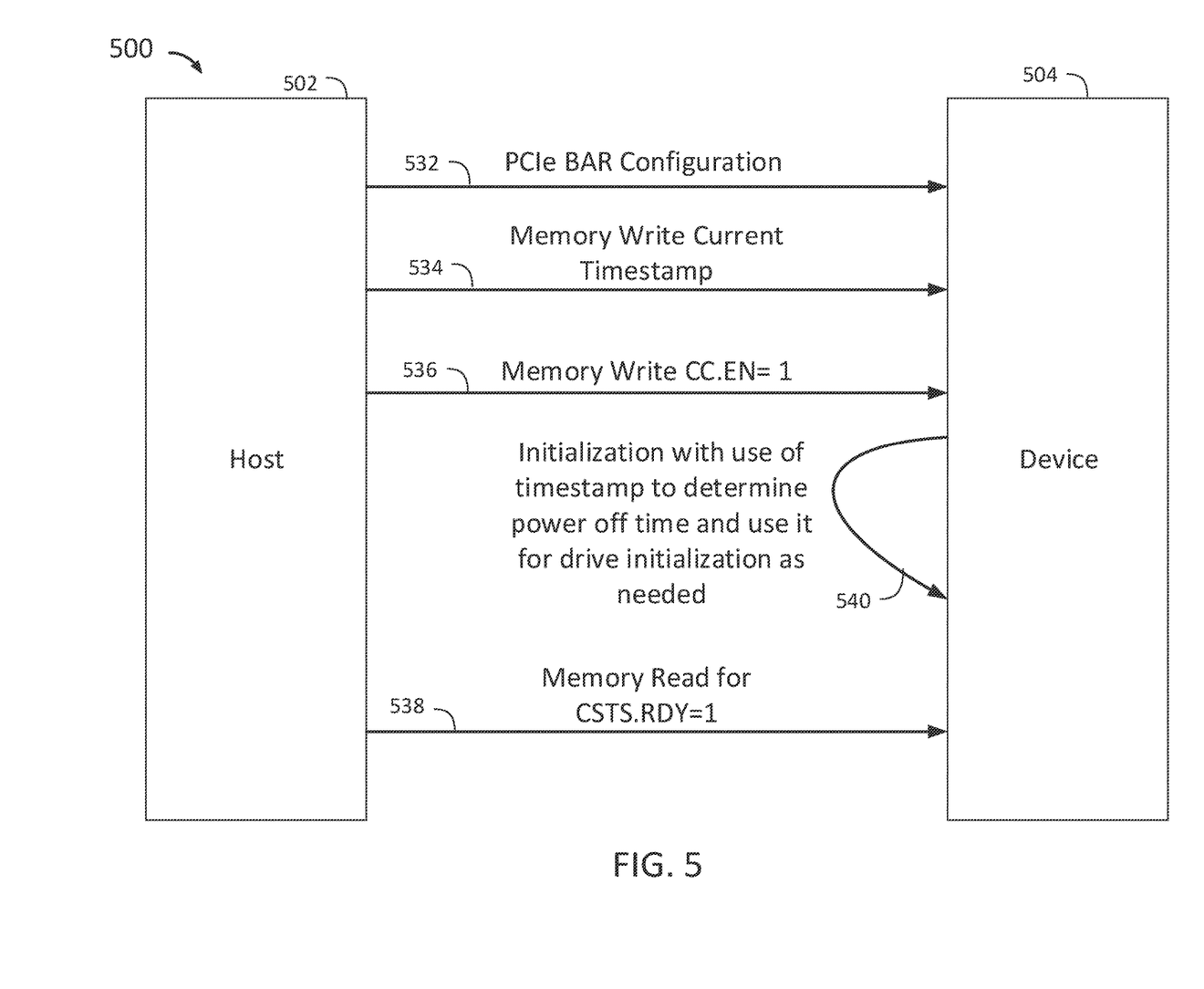
FIG. 5 shows a block diagram of a process of receiving, at an SSD, a power-on timestamp from a host, prior to execution of instructions for a boot-up mode of the SSD.

FIG. 5 shows a block diagram 500 of a process of receiving, at device 504, a power-on timestamp from a host, prior to execution of boot-up mode instructions by the SSD. The block diagram 500 includes a host 502 and a device 504. The host may be the host 102 of FIG. 1, host 402 of FIG. 4, or any device controlling a device that uses flash memory to store data essential to a normal booting process. The device 504 may be the SSD 104 of FIG. 1, SSD 404 of FIG. 4, or any device that uses flash memory to store data essential to a normal booting process, for example an Ethernet NIC or PCIe device. The host 502 and device 504 are communicatively coupled.

The host 502 performs a PCIe Base Address Register (BAR) configuration 532 to the device 504 to begin configuration of the device 504 by reading and writing its BAR registers. During device enumeration of after configuration of the registers, the host 502 performs a memory read and memory write to the memory mapped device registers. The host 502 then transmits a memory write current timestamp command 534 to the device 504 to write the current time to a timestamp register (i.e., a new register, as disclosed in this application) as a power-on time. The host 502 continues to initialize the device 504 by transmitting a memory write CC.EN=1 command 536 to the device 504 to set the enable bit to 1, beginning the initialization and boot process. The device 504 initialization continues 540 with the use of the timestamp to determine power-off duration and use for drive initialization as required. The device 504 uses the current timestamp information as well as information from a saved timestamp from the last power-off of the device 504 to determine how long the device was powered off prior to being powered on, and an appropriate boot-up mode based on the power-off duration. This process is described with respect to FIG. 4. Finally, the host 502 performs a memory read 538 on the device 504 to determine if the device 504 is initialized and ready to receive commands from the host 502. The host 502 performs a memory read for CSTS.RDY=1 to determine if the device 504 has set the ready bit to 1 indicating initialization and execution of instructions for boot-up are complete and the device 504 is ready to receive I/O commands from the host 502.

FIG. 6 shows a decision chart 600 for determining a boot-up mode of an SSD based on a power-off duration. The process begins at step 602, for example upon power being supplied to a controller of an SSD. At step 604, the controller receives a power-on timestamp from a host into a register of the controller. At step 606, the controller retrieves a power-off timestamp stored in the non-volatile memory at the last power down of the controller. At step 608, the controller determines a power-off duration of the SSD based on the power-on timestamp supplied by the host and the power-off timestamp stored in the memory. At step 610, the controller determines whether the power-off duration satisfies a first threshold. The first threshold is either a predetermined value or a value calculated and updated by the controller and set in non-volatile memory. A default initial value may be pre-determined and stored in ROM or non-volatile memory, thereafter an updated value may be calculated based on operating condition parameters of the SSD, including, but not limited to, the type of NAND flash memory in the SSD, the number of program/erase cycles already experienced by the NAND flash memory, the temperature conditions under which the NAND flash memory previously operated under while powered up, the current temperature and so on. In some implementations, in addition to writing a power-on timestamp to the SSD, a host may also write to additional registers with a temperature profile, such as the maximum/minimum/average ambient temperatures which occurred while the SSD was powered off, in order that the SSD may better estimate or calculate the retention time of the NAND flash memory in the SSD. The first threshold may be the offline data retention time of the NAND flash memory 111 of the SSD.

If the controller determines at step 610 that the power-off duration does satisfy the first threshold (YES) and the power-off duration is longer than the offline data retention time such that unrecoverable errors are likely, the process continues to step 612, and the controller executes instructions for a factory boot-up mode using microcode and instructions stored in non-volatile memory such as the NOR ROM. The factory boot-up mode instructions boot the controller and SSD as if it were powered on for the first time. If the controller determines that the power-off duration determines at step 610 that the power-off duration does not satisfy the first threshold (NO) because the power-off duration is equal to or less than the offline data retention time, the process continues to step 614 where the controller determines if the power-off duration satisfies a second threshold. The second threshold may be the time duration that blocks in the SSD memory can be in an erased state during power-off.

If the controller determines at step 614 that the power-off duration fails to satisfy the second threshold (NO), such that the power-off duration is shorter than or equal to the maximum time duration that the blocks in the SSD memory can be in an erase state during power-off, the controller continues to step 616 and performs a normal boot process based on instructions stored in the flash memory and continues to write to partially written blocks without a refresh. If the controller determines at step 614 that the power-off duration satisfies the second threshold (YES) and the power-off duration is longer than the time duration that blocks can be in an erased state during power-off, the controller continues to step 616 and the controller performs a normal boot process based on instructions stored in the flash memory and performs a refresh of the partially written blocks by writing the data written to the blocks to a new block and erasing the old block. The controller then continues writing to the new block. Having the information to determine the power-off duration of the SSD available to the controller prior to beginning the boot process of the drive enables the controller to make decisions to ignore the flash memory read errors and boot in a factory mode or to boot as normal from the flash memory employing some error correction method. Further, the information enables the controller to make additional decisions about processes to utilize after successful execution of boot-up mode instructions, such as whether to refresh partially written blocks.

FIG. 7 shows a flow diagram for a method 700 of determining a boot-up mode of an SSD. At step 702, the controller (for example controller 106 of FIG. 1, or controller 406 from FIG. 4) receives a power-on timestamp from the host at a hardware register of the controller upon power up of the controller. The host writes the timestamp to the hardware register during the controller initialization process and before the controller has fully booted up or accessed flash memory. At step 704, the controller retrieves a power-off timestamp from a first non-volatile memory coupled to the controller. The power-off timestamp was previously saved by the controller into the non-volatile memory prior to the last power-off of the SSD.

At step 706, the controller compares the power-on timestamp and the power-off timestamp to determine a delta time. The SSD subtracts the power-off timestamp retrieved from the first non-volatile memory from the power-on timestamp received from the host to determine the delta time. The delta time is the power-off duration of the SSD. At step 708, the controller determines a boot-up mode of the SSD based on a comparison of the delta time to a threshold. In some implementations, the threshold may be a preset default threshold, or it may be a threshold calculated by the SSD controller and updated based on the operating conditions of the SSD, indicative of the offline data retention time of the SSD. The threshold may be on the order of days, weeks, months or years. In some implementations, the threshold is three months. In some implementations, the threshold is temperature dependent. In some implementations, the threshold is dependent on the number of program/erase cycles the NAND flash memory of the SSD has been subjected to.

If the delta time satisfies the threshold, the controller proceeds with a factory reset boot mode, and if the calculated delta time fails to satisfy the threshold, the controller initializes the controller and SSD as usual including accessing boot instructions and metadata in the flash memory. If the calculated delta time meets or exceeds the preset offline data retention time of the SSD, the controller chooses not to try to retrieve the previous state of the SSD from NAND because there is high risk of unrecoverable errors causing the SSD to become unusable. Instead, the controller boots the SSD using a factory boot mode as if the SSD were being powered on for the first time.

By enabling the controller of an SSD to determine a power-off duration, failure of the drive upon start-up after a long power-off period can be avoided. The SSD is able to make boot-up mode decisions based on the comparison of the power-off duration to a set threshold to determine whether to boot up as normal using instructions stored in flash memory, or if the power-off duration is too long and unrecoverable errors are likely, to boot in a factory mode. Providing power-off duration to the controller further allows the controller to make determinations about whether to refresh partially written blocks or to continue writing, which can improve the ready time of the SSD and decrease the unnecessary wear out of the NAND. Further, providing information related to the power-off duration can be useful in a number of devices that use flash memory for storing boot-up mode instructions, such as Ethernet controllers and other PCIe devices. Providing information to allow calculation of the power-off duration improves the efficiency and life of such devices.

Other objects, advantages and embodiments of the various aspects of the present invention will be apparent to those who are skilled in the field of the invention and are within the scope of the description and the accompanying Figures. For example, but without limitation, structural or functional elements might be rearranged consistent with the present invention. Similarly, principles according to the present invention could be applied to other examples, which, even if not specifically described here in detail, would nevertheless be within the scope of the present invention.

I claim:

1. A solid state drive (SSD) comprising:
   a controller having a first non-volatile memory, configured to store a power-off timestamp, and a hardware register accessible by a host; and
   a second non-volatile memory coupled to the controller and configured to store instructions for at least one boot-up mode of the SSD;
   wherein upon power up the controller is configured to:
      receive, in the hardware register, a power-on timestamp from the host,
      determine a time differential between the power-on timestamp and a stored power-off timestamp,
      enter a first boot-up mode if the time differential exceeds a first threshold, and
      enter a second boot-up mode, different from the first boot-up mode, if the time differential does not exceed the first threshold.

2. The SSD of claim 1, wherein during normal boot-up mode the controller is further configured to:
   perform a refresh on partially written blocks in the SSD if the time differential exceeds a second threshold.

3. The SSD of claim 1, wherein the controller is configured to receive the power-on timestamp from the host prior to the controller executing the instructions for at least one boot-up mode of the SSD.

4. The SSD of claim 1, wherein the controller is configured to receive the power-on timestamp from the host prior to setting a status bit accessible to the host indicating a readiness to receive a storage command from the host.

5. The SSD of claim 1, wherein the first non-volatile memory is configured to store a history of power-off and power-on timestamps.

6. The SSD of claim 5, wherein the controller is configured to determine a cumulative power-off duration based on the history of power-off and power-on timestamps.

7. The SSD of claim 1, wherein the controller is configured to determine an error correction mode based on the power-on timestamp and the stored power-off timestamp.

8. The SSD of claim 1, wherein the controller is configured to determine whether to refresh one or more blocks of memory based on the power-on timestamp and the stored power-off timestamp.

9. The SSD of claim 1, wherein upon shutdown the controller is configured to store a power-off timestamp in the first non-volatile memory.

10. The SSD of claim 1, wherein the hardware register is a PCIe hardware register.

11. The SSD of claim 1, wherein the controller is configured to periodically update a current timestamp in the first non-volatile memory.

12. The SSD of claim 1, wherein the received power-on timestamp from the host is received as a memory write command with a current host system timestamp.

13. A method of determining a boot-up mode of a solid state drive (SSD), the method comprising:
  receiving, at a hardware register of a controller, a power-on timestamp from a host upon power up of a controller;
  comparing the power-on timestamp and a power-off timestamp stored in the SSD to determine a time differential between the power-on timestamp and the power-off timestamp;
  entering a first boot-up mode if the time differential exceeds a first threshold; and
  entering a second boot-up mode, different from the first boot-up mode, if the time differential does not exceed the first threshold.

14. The method of claim 13, further comprising:
  performing a refresh on partially written blocks in the SSD if the time differential exceeds a second threshold, and
  skipping the refresh on partially written blocks in the SSD if the delta time does not exceed the second threshold.

15. The method of claim 13, wherein receiving the power-on timestamp comprises receiving the power-on timestamp from the host prior to the controller executing the instructions for at least one boot-up mode of the SSD.

16. The method of claim 13, further comprising:
  receiving the power-on timestamp from the host prior to setting a status bit accessible to the host indicating a readiness to receive a storage command from the host.

17. The method of claim 13, further comprising:
  updating a current timestamp stored in the first non-volatile memory periodically.

18. The method of claim 13, further comprising:
  storing a history of power-on and power-off timestamps in the first non-volatile memory.

19. The method of claim 13, further comprising:
  storing a power-off timestamp in the first non-volatile memory upon power down.

20. The method of claim 13, further comprising:
  determining an error correction mode based on the power-on timestamp and the stored power-off timestamp.

21. The method of claim 13, further comprising:
  determining whether to refresh one or more blocks of memory based on the power-on timestamp and the stored power-off timestamp.

* * * * *